United States Patent
Ferrell et al.

(10) Patent No.: US 7,645,343 B2
(45) Date of Patent: Jan. 12, 2010

(54) UNIFORM CAVITATION FOR PARTICLE REMOVAL

(75) Inventors: Gary W. Ferrell, San Gregorio, CA (US); Frances Ferrell, legal representative, San Gregorio, CA (US); John F. Schipper, Palo Alto, CA (US); Jagjit S. Ratra, Campbell, CA (US)

(73) Assignee: SEZ America, Inc., Fremont, CA (US)

( * ) Notice: Subject to any disclaimer, the term of this patent is extended or adjusted under 35 U.S.C. 154(b) by 712 days.

(21) Appl. No.: 10/559,894

(22) PCT Filed: Jun. 3, 2004
(Under 37 CFR 1.47)

(86) PCT No.: PCT/EP2004/051020

§ 371 (c)(1),
(2), (4) Date: Jun. 9, 2006

(87) PCT Pub. No.: WO2004/110657

PCT Pub. Date: Dec. 23, 2004

(65) Prior Publication Data

US 2006/0290235 A1     Dec. 28, 2006

(51) Int. Cl.
*B08B 3/10* (2006.01)

(52) U.S. Cl. .......................................... 134/1; 134/1.3

(58) Field of Classification Search ....................... None
See application file for complete search history.

(56) References Cited

U.S. PATENT DOCUMENTS

| 5,762,084 A | 6/1998 | Krusell et al. | 134/184 |
| 6,016,821 A * | 1/2000 | Puskas | 134/186 |

* cited by examiner

*Primary Examiner*—Michael Kornakov
*Assistant Examiner*—Ryan Coleman
(74) *Attorney, Agent, or Firm*—Schneck & Schneck; Thomas Schneck

(57) ABSTRACT

Systems and methods for promoting a substantially uniform cavitation field. With system (100) including a diaphragm (109) dividing a container (103), a second energy pulse corresponding to a first energy pulse arising from collapse of a cavity C is produced and is used to determine whether to adjust a corresponding transducer 121-*k*. In system (16), a cavity creating unit (11), including an assembly of transducers 15-*i*, is moveable from a test liquid to a particle removal (PR) liquid after transducer testing. In another system, a sensor plate (170) having an array of sensors 171-*j* provides a virtual wafer. A substantially uniform field of cavitation may be maintained by a cavity enhancement liquid, or adjustment of transducer energy. Mechanisms of holding an object produce substantially uniform cavitation. Opposed transducers in a container having monotonically decreasing and/or increasing cavitation density produce substantially uniform cavitation density.

9 Claims, 13 Drawing Sheets

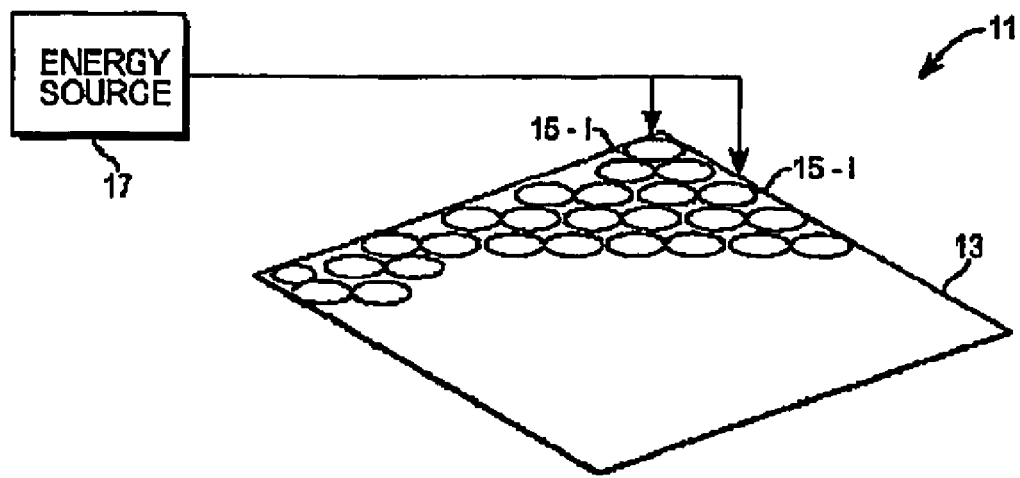
Fig._1
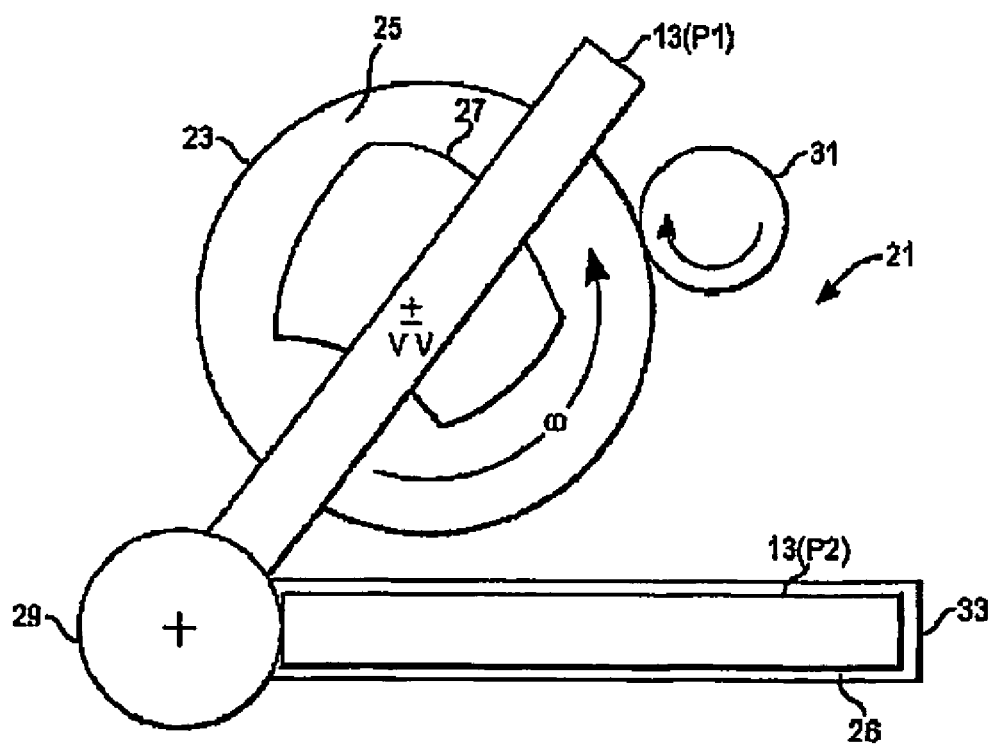
Fig._2

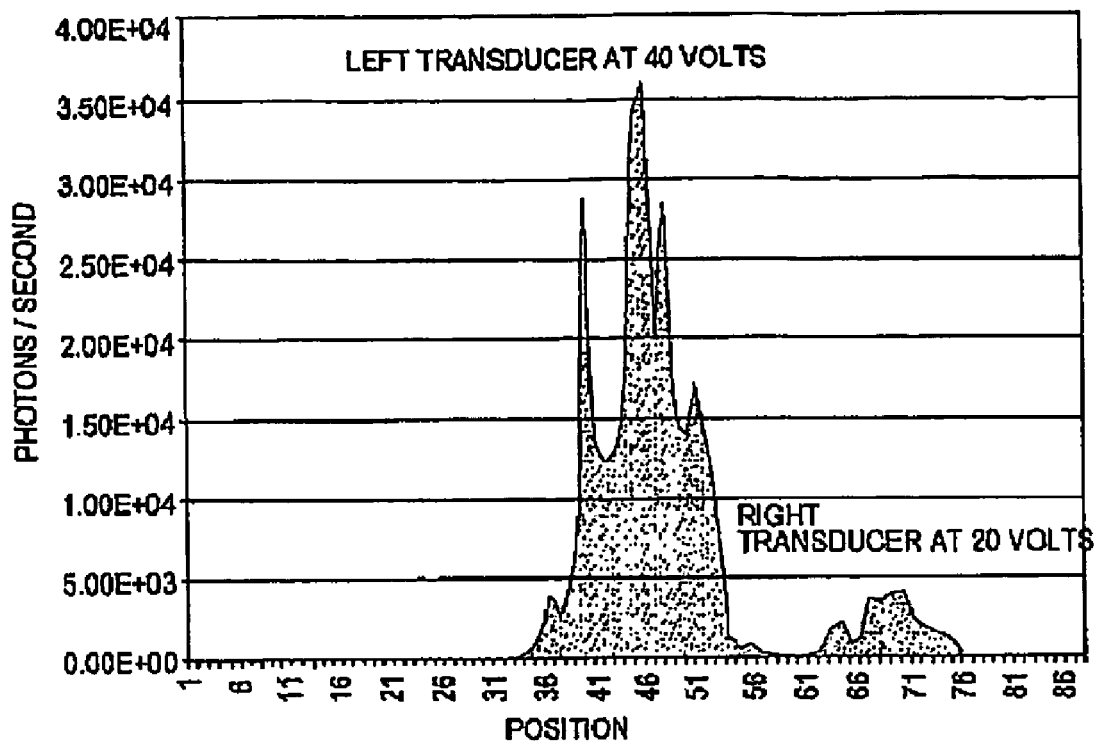
Fig._4B
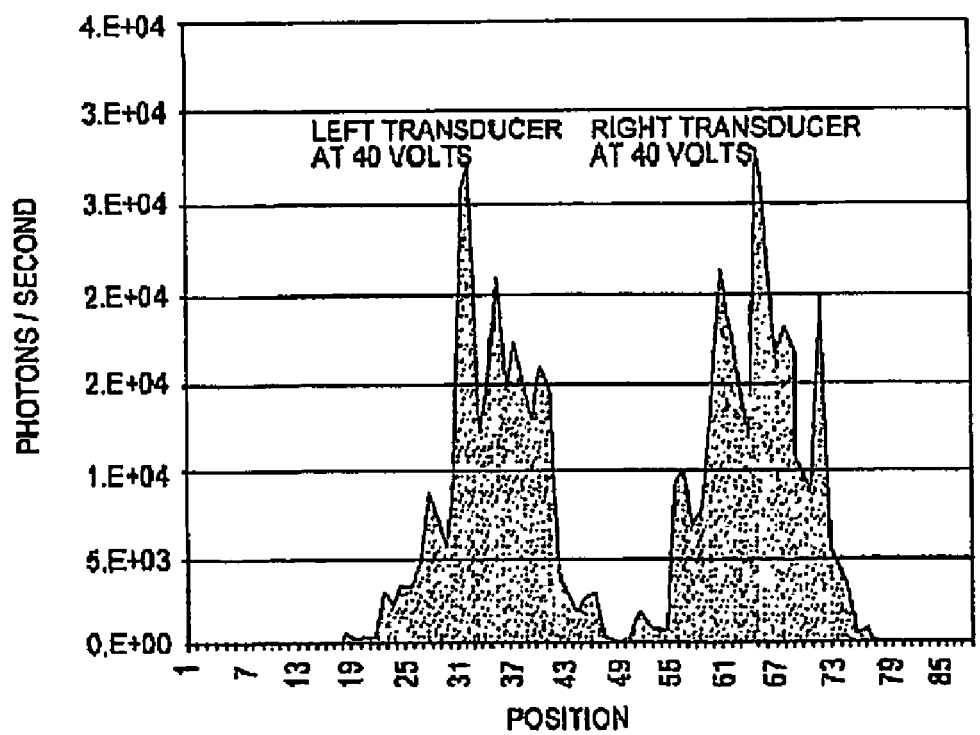
Fig._4A

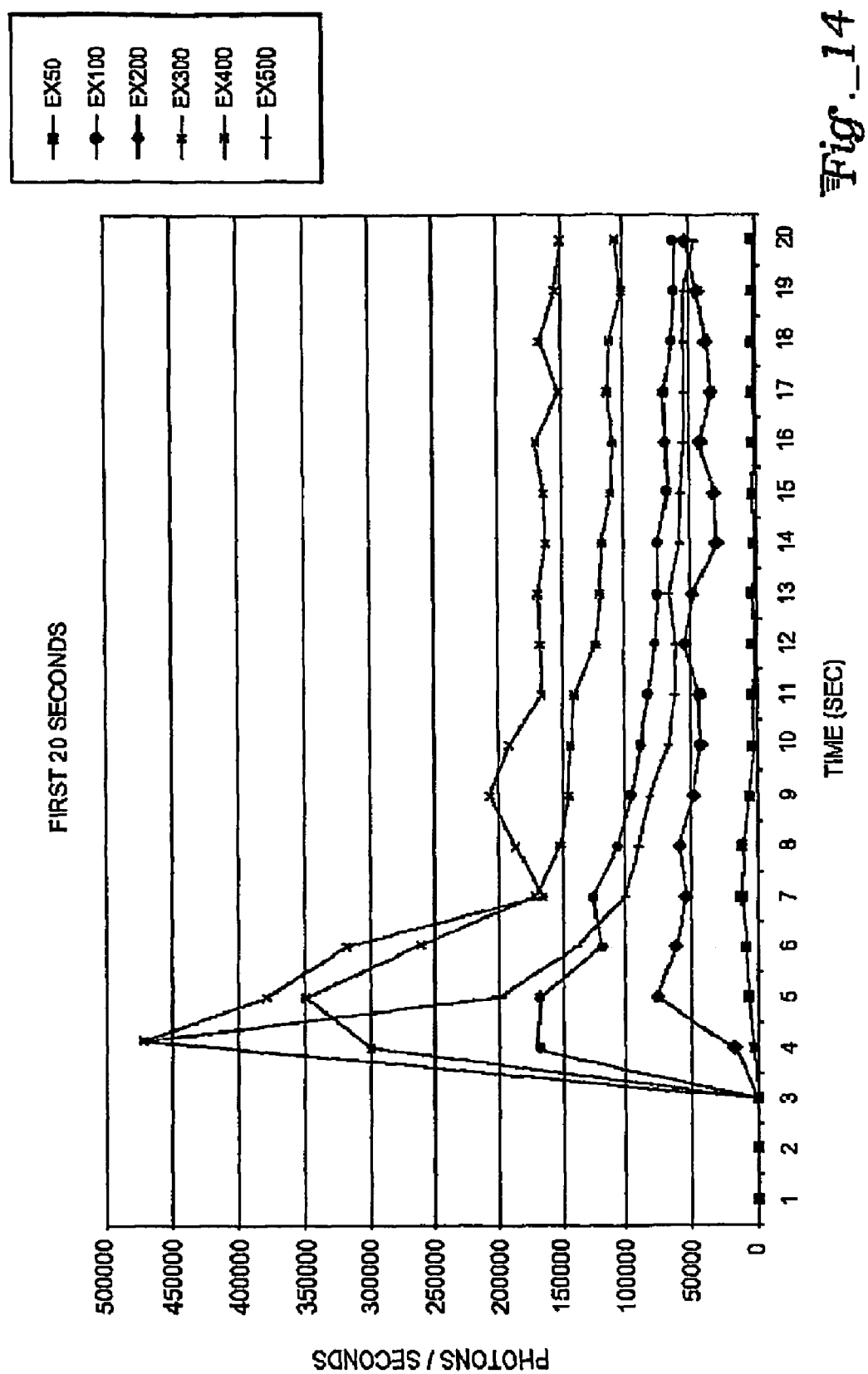
Fig._14

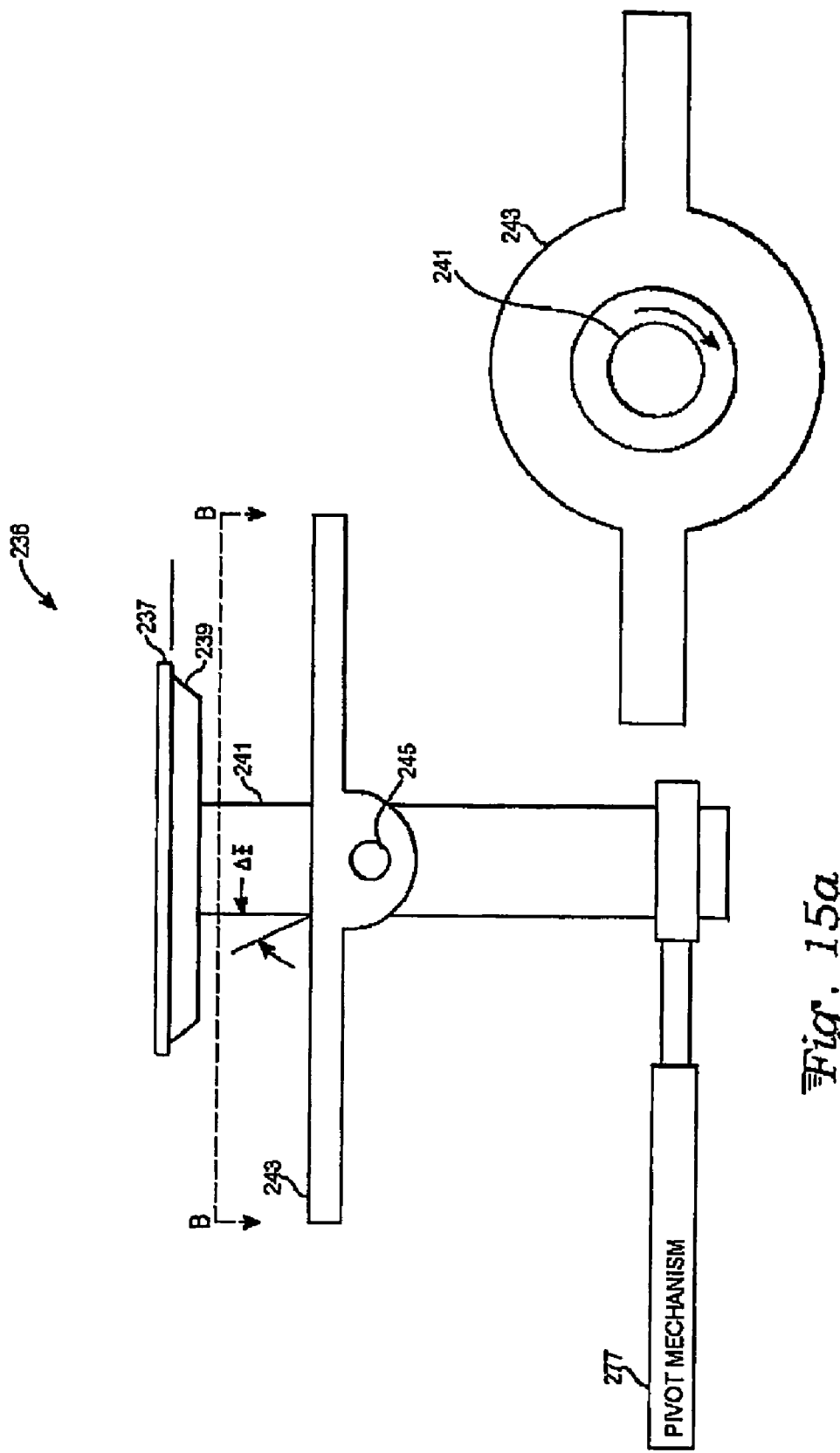
Fig._15a
Fig._15b

UNIFORM CAVITATION FOR PARTICLE REMOVAL

TECHNICAL FIELD

This invention relates to control of liquid cavitation for particle removal from a surface.

BACKGROUND ART

One attractive approach for removal of small particles in cleaning processes, such as semiconductor wafer and chip processing, is use of acoustic cavitation in liquids, whereby voids or cavities are created in a liquid and subsequently caused to implode, to undergo micro-acoustic streaming, or to otherwise transfer energy from a cavity to one or more particles adjacent to the (former) cavity. If these (unwanted) particles are located on and temporarily attached to an adjacent surface, such as a semiconductor wafer or chip, these particles can be removed by the force of a collapsing cavity or by micro-acoustic streaming. The frequencies used to induce cavitation in a liquid are often of the order of 1 MHz, and the corresponding cavitation systems are sometimes referred to as megasonic systems.

However, two problems associated with use of cavitation for particle removal with the systems available today are (i) the inhomogeneity of the sizes and density of the cavities or voids created, before collapse occurs, and (ii) the resulting non-uniformity in local particle removal. What is needed are systems and methods that provide and maintain reasonable homogeneity in acoustic cavitation density and that allow a representative cavitation density to be varied according to the nature of the particles to be removed from a surface.

DISCLOSURE OF THE INVENTION

These needs are met by the invention, which provides systems and associated procedures that (i) provide some control over the initial size of the cavities or voids created, (ii) provide reasonable uniformity in the initial cavity sizes and (iii) maintain the size uniformity by individual or batch-to-batch monitoring of the cavities thus created.

By individually testing and adjusting the transducers, batch to batch excursions of relevant parameters, such as cavity size, are minimized and uniformity is encouraged or enforced. Single surface treatment and batch treatments are provided.

In one system and procedure, the cavities are created, and cavity size is controlled, by use of a cavity creating unit (CCU), including a plurality of closely spaced transducers that produce a corresponding plurality of acoustic cavities as the CCU is immersed in an adjacent portion of a liquid containing a solid surface from which attached particles are to be removed. Between uses of the CCU to remove particles from a surface, the CCU is temporarily isolated, and each transducer is separately tested to determine the size and scope of the cavities produced by that transducer. The power and/or excitation signal applied to each transducer is separately adjusted to maintain uniformity in cavity size and any other parameter(s) relevant to particle removal.

Uniform cavitation is promoted by a system and method including a diaphragm dividing a container of liquid into first and second portions. Acoustic cavitation from a transducer in the first portion produces a first energy pulse arising from the collapse of at least one cavity which is received by the diaphragm. A second energy pulse is generated in the second portion of the liquid in response to receipt of the first energy pulse at the diaphragm. The second energy pulse may be measured in the form of a sonoluminescent response. If the sonoluminescent response is outside of a permitted range, the transducer, located at a corresponding location in the second portion of the container, is adjusted.

Further, opposed transducers each producing a cavitation density that is either monotonically increasing as a distance from each transducer increases or monotonically decreasing as a distance from each transducer increases to achieve approximately uniform cavitation are disclosed. Activation of such transducers produces a cavitation density in a particle removal liquid which is approximately uniform along a line segment extending between opposed container walls. Lensed transducers may also be utilized to promote uniform cavitation density.

Also, a determination is made as to whether performance of one or more transducers is acceptable. An array of sensors is positioned in a container of liquid and the one or more transducers is positioned on a container wall. The array of transducers is activated and, over time, a spatial distribution of acoustic cavities is sensed to make the determination.

Mechanisms whereby transducer power is provided in a particular manner and/or whereby cavity enhancement liquid is provided, result in more uniform cavitation. Also, a determination may be made as to a number of transducers required to produce a desired cleaning power.

Mechanisms resulting in uniform cavitation include holding an object in a holder in which the object is allowed to move laterally in a range of 0.1 times the thickness of the object. Additionally, a ditherable shaft upon which an object rests approximates a free wafer so that on the average, no region on the object is subjected to substantially more, or substantially less, cavitation.

BRIEF DESCRIPTION OF THE DRAWINGS

FIGS. 1-3, 8-10 and 13 illustrate systems used to practice the invention.

FIGS. 4A and 4B graphically illustrate increase of measured cavity density with increase in input energy E(f).

FIG. 14 graphically shows cavitation activity versus transducer power.

FIG. 15a illustrates a device used for angle dithering to randomize acoustic effects.

FIG. 15b illustrates a cross section of the device of FIG. 15a taken along the line B-B.

BEST MODE FOR CARRYING OUT THE INVENTION

Figure 3:
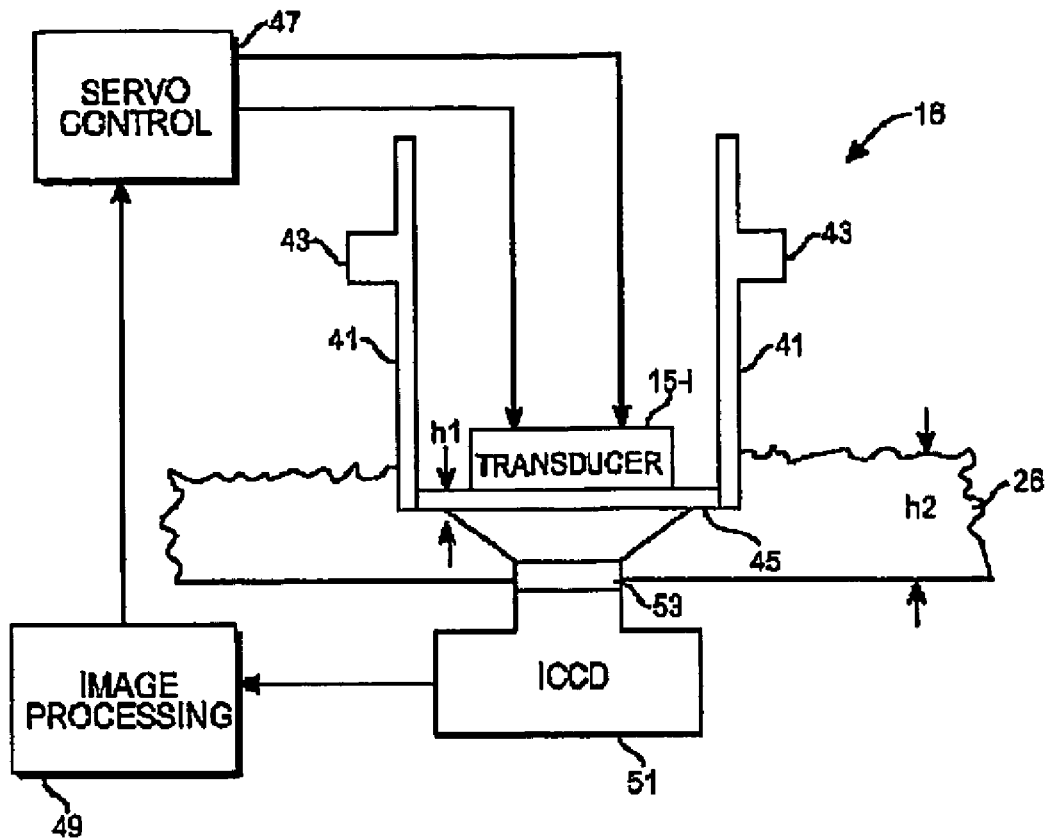

FIG. 1 shows a perspective view of a cavity creating unit (CCU) 11 that may be used to practice the invention. In this embodiment, the CCU 11 includes a polygonally shaped bar (e.g., a triangle, quadrilateral, pentagon or etc.) or curvilinearly shaped bar 13 that includes two or more transducers, 15-$i$ ($i=1, \ldots, I; I \geq 2$), each of which is capable of producing one or more cavities in a liquid in which the transducer is immersed. The transducers 15-$i$ are individually driven by an energy source 17 so that the energy delivered to each transducer can be individually adjusted. Preferably, the energy source 17 includes a control mechanism that permits adjustment of (i) the energy delivered per unit time to each transducer 15-$i$ and (ii) the frequency at which each transducer is driven. Preferably, the energy source 17 can provide two or more distinct drive frequencies for each transducer 15-$i$.

The CCU 11 is part of an assembly 21, shown in a top view in FIG. 2, that includes: the CCU 11 and transducers (not shown in FIG. 2); a liquid container 23 that is partly or wholly open at the top; a selected liquid 25 within the container; one or more surfaces 27, immersed in the liquid, from which one or more attached particles are to be removed; a CCU re-orientation mechanism 29 that (i) positions the CCU 11 over the liquid 25 in a first position P1 and (ii) rotates the CCU 11 to a second position P2 that is spaced apart from the container 23 and the liquid 25, for transducer testing and adjustment; and a container rotation mechanism 31 that causes the container 23 to rotate at a selected angular velocity w about a selected vertical axis V-V, preferably a vertical axis that passes through a center of the container.

In the second position P2, the CCU bar 13 is immersed in a second container 33 of a second selected liquid 26 (preferably, but not necessarily, the same as the first liquid 25) for individual or group testing of action of the transducers 15-$i$ (FIG. 1), as discussed in the following in connection with FIG. 3.

FIG. 3 is a sectional side view of a transducer test assembly 16, one of a group of two or more such assemblies, that can be used as part of the CCU shown in FIGS. 1 and/or 2. The transducer assembly 16 includes a CCU housing 41, which may be a hollow cylinder having a lateral housing extension 43 and having a thin diaphragm 45 (thickness h1≈0.1-1 mm) that supports a transducer 15-$i$ that vibrates with a selected output energy E(f) at one or more selected output frequencies, $f=f_n$, in a range 100-3000 KHz. In the second position P2, the transducer 15-$i$ is electrically connected to a servo control module 47 that adjusts one or more of (1) the output energy E(f) and (2) the output frequency, $f=f_n$, in response to receipt of a selected feedback signal at the servo control module 47. The servo control unit 47 is connected to an image processing module 49, which receives signals from an ICCD image forming module 51. In a CCU monitoring mode, the diaphragm 45 and a small portion of the bottom of the housing 41 are immersed in a small thickness h2 of the second liquid 26, where the liquid thickness h2=0.1-5 mm.

The ICCD module 51 is positioned so that an ICCD sensor 53 faces the diaphragm 45 and transducer 15-$i$ (FIG. 1) and forms an image of one or more acoustic cavities produced in the liquid L when the transducer 15-$i$ is activated. The ICCD sensor 53 primarily measures or otherwise senses a volume density ρ(cav) of acoustic cavities, which can vary linearly or nonlinearly with the energy input E(f) at an input frequency f. The maximum diameter of a pre-collapsed cavity produced by a transducer 15-$i$ will decrease monotonically with an increase in input frequency, $f=f_n$, and will depend upon relevant characteristics of the liquid, such as wave propagation velocity in the liquid and surface tension of the liquid. Variation of the input frequency, $f=f_n$, can indirectly cause a variation in the volume density ρ(cav), for example, by decreasing the volume density as the maximum pre-collapse diameter increases.

FIGS. 4A and 4B graphically display measurements by a sensor, across a field of two adjacent transducers (separation distance=0.5-5 cm), of acoustic cavities produced with an input frequency, $f=f_n$=1 MHz, for input energies corresponding to (1) 40 volts and 40 volts (FIG. 4A) and (2) 40 volts and 20 volts (FIG. 4B). The maximum cavity densities for 40 volts is approximately 7 times as large as the cavity volume density for 20 volts. For this experiment, the cavity density appears to increase nonlinearly with increase in input energy E(f).

Figure 5:
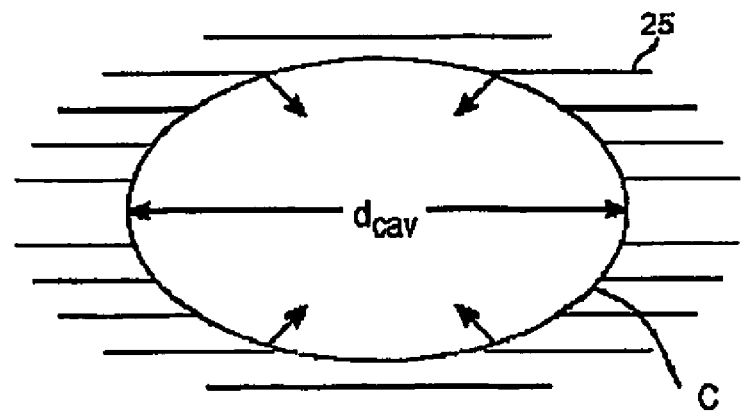
FIG. 5 illustrates a pre-collapse cavity and its diameter.

FIG. 5 illustrates a cavity C, produced by an activated transducer and having a pre-collapse diameter $d_{cav}$ (before cavity collapse) that is partly or fully determined by the output frequency $f_n$ and by one or more parameters of the liquid, such as 25, as indicated in the figure, or 26. Within the cavity is a void. Ideally, each cavity C produced by each transducer 15-$i$ has a pre-collapse cavity diameter $d_{cav}$ with precisely the same, or substantially the same, value (e.g., 25 μm). A preferred range of transducer output frequencies $f_n$ is 100-3,000 KHz, which can generate pre-collapse cavity diameters $d_{cav}$ in a range 0.1-1 mm.

In practice, an average cavity density ρ(cav) produced by a given transducer 15-$i$ (FIG. 1) will vary with time as the transducer ages, and because of several environmental factors, and transducer-to-transducer variation will occur as well. The system shown in FIG. 3 tests each transducer 15-$i$, when the CCU bar 13 is in the second position, to determine an average density ρ(cav;i) of cavities presently produced by this transducer and compares this density with a reference or "ideal" cavity density ρ(cav;ref). If the magnitude of the difference, |ρ(cav;i)−ρ(cav;ref)| is greater than a selected non-negative threshold value $\Delta\rho_{thr}$ (which may be 0), the energy output E(f) and/or the output frequency, $f=f_n$, is adjusted (separately, for each transducer) to reduce the difference in magnitude to No more than $\Delta\rho_{thr}$, or to minimize the difference in magnitude if this magnitude cannot be reduced to no greater than $\Delta\rho_{thr}$. After each transducer 15-$i$ has been tested and the input energy E(f) and/or the input frequency, $f=f_n$, for each transducer has been adjusted accordingly, the CCU 11 and associated transducers 15-$i$ are moved to the first position P1 in FIG. 3, and one or more surfaces 27, immersed in the first liquid 25, is cleaned. Preferably, the individual transducers 15-$i$ (FIG. 1) are retested and adjusted before each surface 27 is cleaned. The time required for testing and adjustment may vary from about 15 sec to about 45 sec, or greater if desired.

As a first alternative, this testing and adjustment procedure may be performed after N surfaces 27 have been cleaned, where N is a selected integer greater than 1. As a second alternative, this testing and adjustment procedure may be performed on a randomly chosen subset of all the transducers 15-$i'$; and if each transducer 15-$i'$ in this subset satisfies |ρ(cav;i')−ρ(cav;ref)|≦$\Delta\rho_{thr}$, the testing and adjustment procedure is terminated and the CCU 11 and associated transducers are returned to the first position P1 for surface cleaning.

Figure 6:
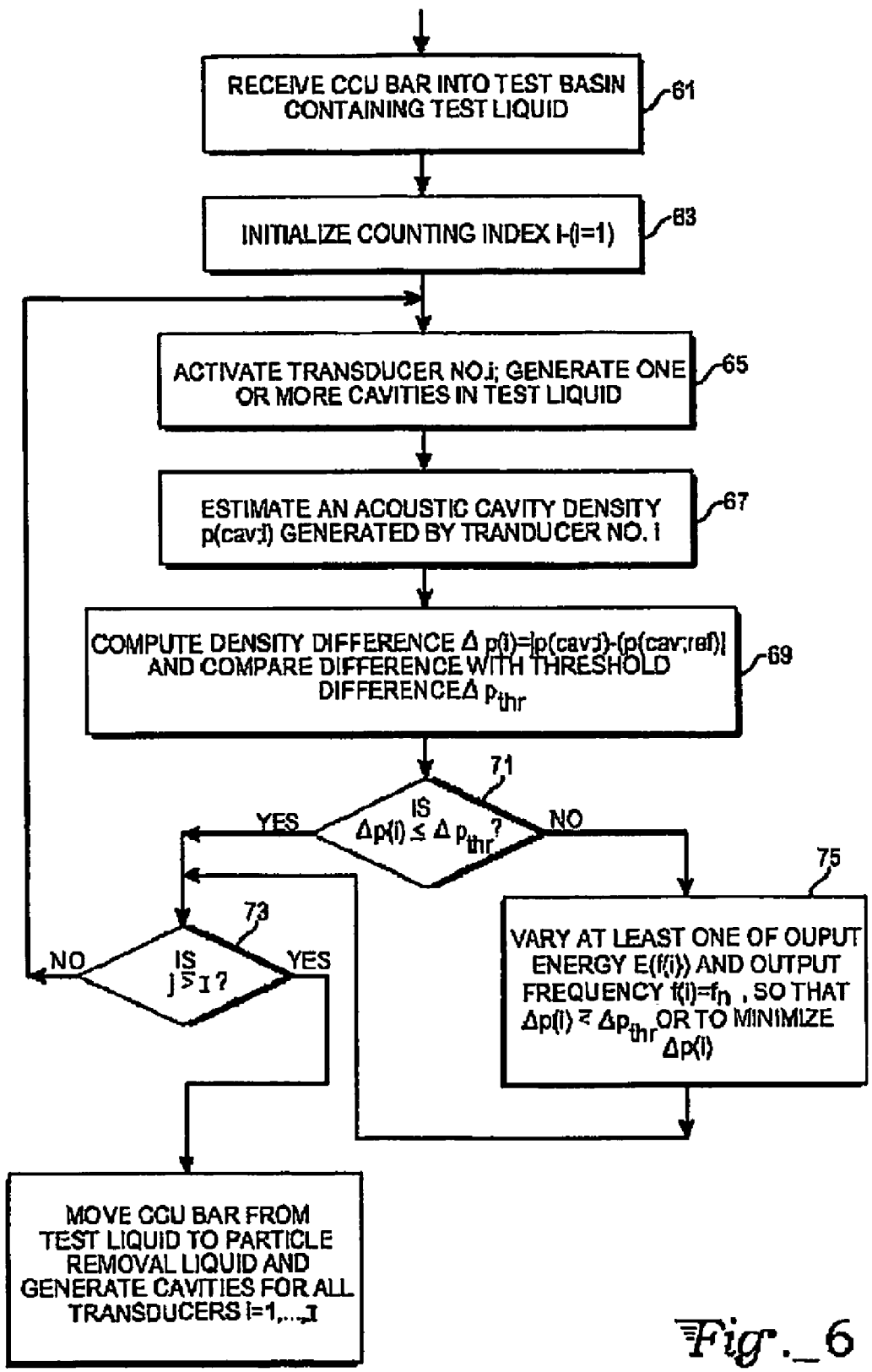
FIGS. 6 and 7 are flow charts of procedures for practicing the invention.

FIG. 6 is a flow chart of a procedure for practicing the invention. In step 61, a CCU, including two or more transducers, is received into a testing basin (e.g., the container 33 in FIG. 2) containing a selected test liquid. In step 63, a counting index i, having a range i=1, ..., I, where I (≧2) is the number of transducers on the transducer bar, is initialized (e.g., i=1). In step 65, transducer number i is activated, and one or more pre-collapse cavities is formed in the test liquid. In step 67, a representative cavity density ρ(cav) is estimated, preferably using an imaging mechanism such as the ICCD module 51 in FIG. 3. In step 69, a magnitude of a density difference Δρ(i)=|ρ(cav;i)−ρ(cav;ref)| is computed and compared with a selected non-negative threshold density difference $\Delta\rho_{thr}$. In step 71, the system determines if Δρ(i)≦$\Delta\rho_{thr}$. If the answer to the query in step 71 is "yes," the system moves to step 73 and determines if the counting index satisfies $i \geq I$. If the answer to the query in step 73 is "yes," the system optionally moves the CCU out of the test liquid, moves or re-orients the CCU, immerses the CCU in a particle removal liquid, and uses all transducers, as adjusted, to generate two or more cavities in the particle removal liquid, in step 75.

If the answer to the query in step 73 is "no," the system increments i (i→i+1) and returns to step 65, and steps 65 through 71 are repeated at least once. If the answer to the query in step 71 is "no," in step 77 the system varies at least one of (i) an output energy E(f) associated with the transducer number i and (ii) an output frequency, $f = f_n$, of the transducer number i, until at least one of the following two conditions is satisfied: (1) the density difference $\Delta\rho(i) = |\rho(cav;i) - \rho(cav;ref)|$ is reduced to a value no greater than the threshold difference $\Delta\rho_{thr}$ and (2) the density difference $\Delta\rho(i) = |\rho(cav;i) - \rho(cav;ref)|$ is minimized. The system then moves to step 73.

Figure 7:
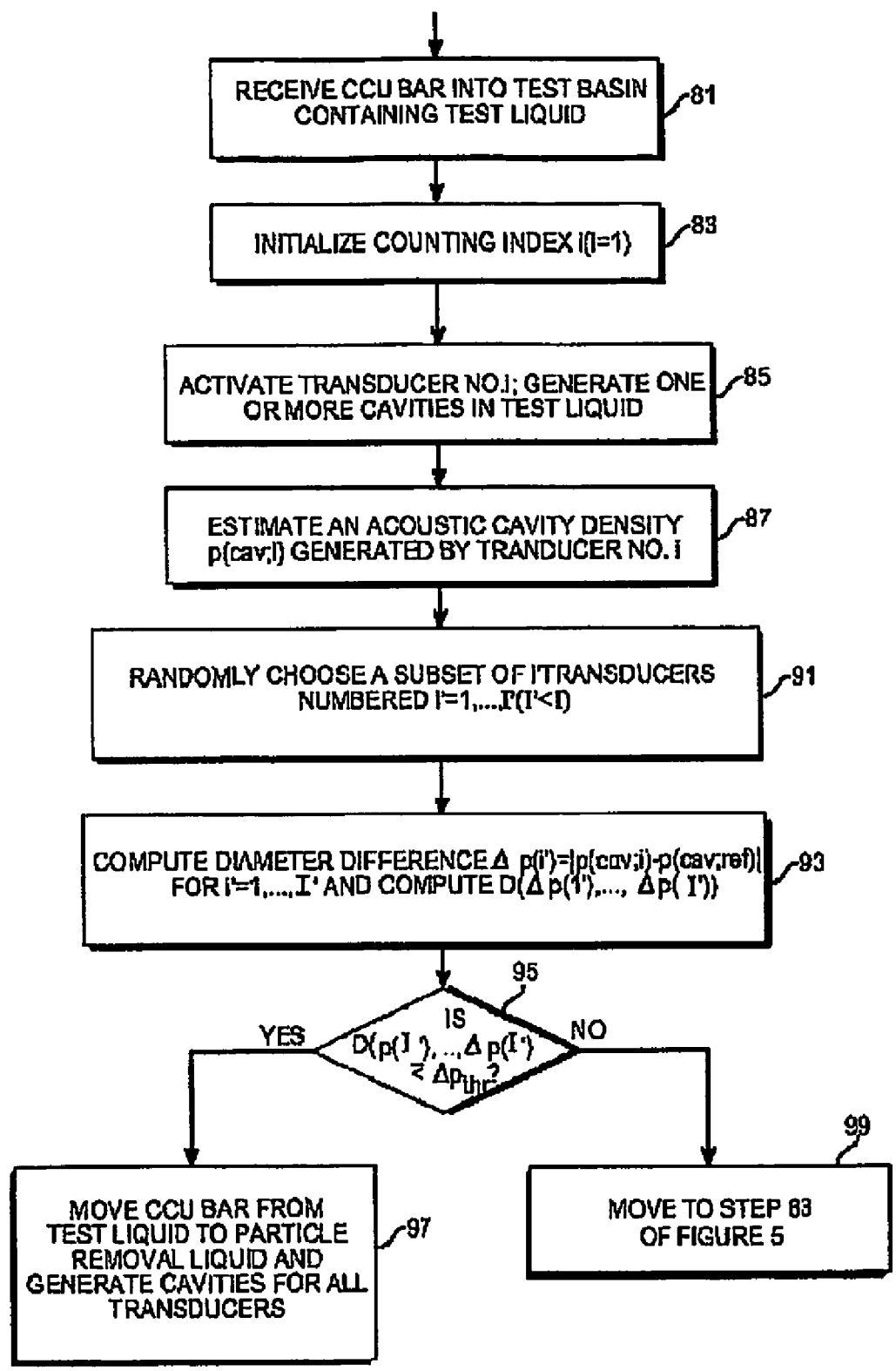

FIG. 7 is a flow chart of an alternative procedure for practicing the invention. Steps 81, 83, 85 and 87 correspond to the respective steps 61, 63, 65 and 67. In step 89, a subset, having a selected number I' of members (numbered i'=1, ..., I', with $1 \leq I' < I$), of the set of I transducers is randomly chosen.

In step 91, a cavitation density difference $\Delta\rho(i') = |\rho(cav;i') - \rho(cav;ref)|$ is computed, for i'=1, ..., I', and a representative average $D(\Delta\rho(1'), \ldots, \Delta\rho(I'))$ is computed, depending upon one or more of the difference values $\Delta\rho(i')$. In step 93, the system determines if $D(\Delta\rho(1'), \ldots, \Delta\rho(I'))$ is greater than the selected threshold difference $\Delta\rho_{thr}$.

For example, the representative average D may be a weighted linear or nonlinear average, such as $$D(\Delta\rho(1), \ldots, \Delta\rho(I)) = \left\{ \sum_{i=1}^{I} w(i) \times \{\Delta\rho(i)\}^p \right\}^{1/p} \quad (1)$$

where $\rho$ is a selected positive number and w(I') are non-negative weighting coefficients satisfying $$\sum_{i=1}^{I} w(i) = 1 \quad (2)$$

The quantity $$D(\Delta\rho(1), \ldots, \Delta\rho(I))$$

represents an average of the difference magnitudes for the randomly chosen subset of I' transducers. If one allows the exponent $\rho$ to increase without limit and assumes that w(i')>0 for all indices i' in the subset, for very large values of $\rho$, the quantity D in Eq. (1) approaches $$D(\Delta\rho(1), \ldots, \Delta\rho(I)) \approx \Delta\rho(i;max) = \max\{\Delta\rho(1), \ldots, \Delta\rho(I)\} \quad (3)$$

Thus, for very large values of the exponent $\rho$, the quantity $$D(\Delta\rho(1), \ldots, \Delta\rho(I))$$

is approximately the largest value among the difference magnitudes, and this number is compared with the threshold difference $\Delta\rho_{thr}$. In this limit, the maximum magnitude difference $\Delta\rho(i';max)$ is compared with the selected threshold difference $\Delta\rho_{thr}$. For lower values of the exponent p, the quantity $$D(\Delta\rho(1), \ldots, \Delta\rho(I))$$

provides other averages. For example, with the choice p=1, the representative average $$D(\Delta\rho(1), \ldots, \Delta\rho(I))$$

becomes a conventional weighted average of the density differences $\Delta\rho$ (i'). With the choice $\rho=2$, the representative average $$D(\Delta\rho(1), \ldots, \Delta\rho(I))$$

becomes a weighted means square average of the density differences $\Delta\rho$ (i').

If the answer to the query in step 93 is "yes," the system terminates the transducer testing process and uses collection of transducers 15-i' (i'=1, ..., I') as is, in step 95, and optionally moves the CCU bar out of the test liquid, moves or reorients the CCU bar, immerses the CCU bar in a particle removal liquid, and uses all transducers, as adjusted, to generate two or more acoustic cavities in the particle removal liquid, in step 97. If the answer to the query in step 95 is "no," the system reverts to the procedure beginning at step 63 in FIG. 5, in step 99.

The test liquid and the particle removal liquid may be the same or may be different in one or both of the procedures in FIGS. 6 and 7. Suitable particle removal liquids include DI water, ammonia ($NH_3$), hydrogen peroxide ($H_2O_2$), sulfuric acid ($H_2SO_4$), and ozone ($O_3$) in DI water or a mixture thereof.

Figure 8:
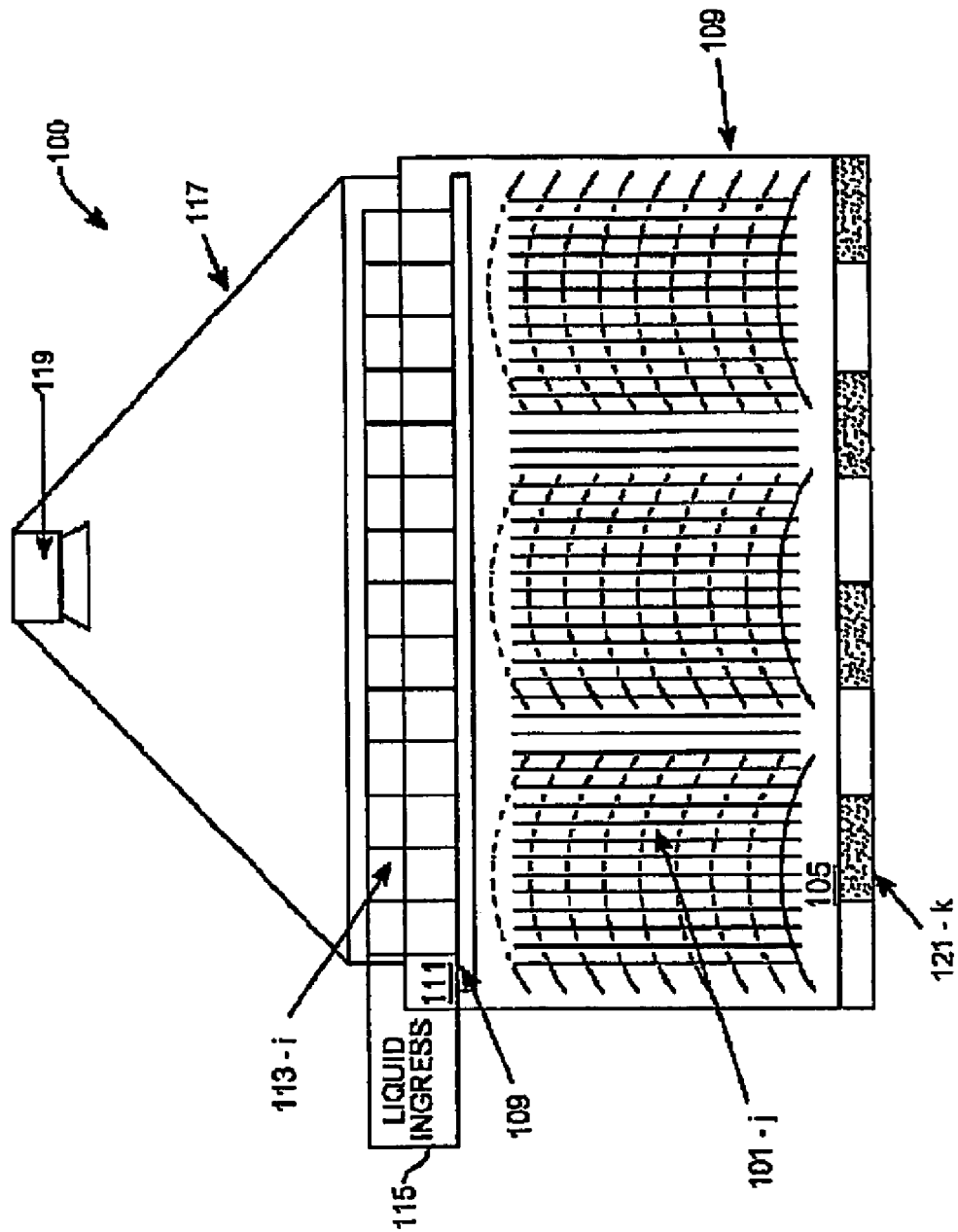

The preceding development is appropriate for surface cleaning of one or a few surfaces, such as semiconductor surfaces, at about the same time. FIG. 8 schematically illustrates a system 100 for cleaning one wafer surface or a batch of two or more surfaces, 101-j, numbered j=1, ..., J ($J \geq 2$), preferably surfaces that are substantially planar. The surfaces 101-j are oriented approximately parallel to each other in a container or tank 103, having an open upper surface and containing a sufficient amount of a selected particle removal liquid 105 to fully immerse each surface, and the removal liquid extends to a thin diaphragm 109 (thickness $h3 \approx 0.1$-1 mm).

Above the diaphragm 109, a test liquid 111 (which may be, but is not necessarily, the same as the particle removal liquid 105) is provided in each of a sequence of test cells 113-i (i= 1, ..., I; $I \geq 2$) that are contiguous to the diaphragm 109 as shown. Test cell materials comprise, for example, tantalum, fused silica, or plastic. Test liquid 111 for the test cells 113-i is fed through a labyrinthine liquid ingress system 115 that permits the liquid to pass but does not permit any light generated extraneous to the cells to enter the cells. That is, the cells 113-i are preferably light-proof. A noble gas (e.g., Ar, Ne, Kr or Xe), preferably at or near saturation concentration, or other materials, are included in the test liquid 111 (e.g., DI water) to promote or encourage sonoluminescent discharge within the cells 113-i in response to receipt of energy waves (from the diaphragm 109) generated by acoustic cavitation on the removal liquid 105.

The assembly of test cells 113-i is covered by a light-proof hood 117 having an apex including an ICCD module 119 that forms a plurality of images of the sonoluminescent response of the test liquid to determine if each transducer is functioning within a permitted range. The sonoluminescent field produced at a given location above the diaphragm 109 and sensed by the ICCD module 119 reflects the acoustic field produced in the removal liquid at a corresponding location below the diaphragm 109.

Acoustic cavitation in the removal liquid 105 is generated by K transducers 121-k, numbered k=1, ..., K ($K \geq 2$) that are positioned on one side of the container 103 to produce the cavities within the removal liquid in the interstitial spaces between adjacent surfaces 101-j. Each transducer 121-k provides an acoustic field for one, two or more of the interstitial spaces between two adjacent surfaces 101-j to be cleaned in the container 103. If one or more of the transducers 121-k is not performing properly, the corresponding sonoluminescent response sensed above the diaphragm 109 in the test liquid 111 will not lie in a permitted response range, and the ICCD module 119 will sense this. In this situation, the energy input E(f) and/or the input frequency, $f=f_n$, is adjusted to bring this portion of the sonoluminescent response into a permitted range, in a manner analogous to the approach discussed in connection with FIGS. 2 and 3.

The acoustic cavitation field produced in the removal liquid 105 is unlikely to be uniform in the z-coordinate direction, especially if the surfaces 101-j to be cleaned have a relatively large length in the z-direction. Acoustic cavitation is likely to decrease approximately monotonically as z increases, because of the increasing distance from the transducer(s) generating the cavitation.

Figure 9:
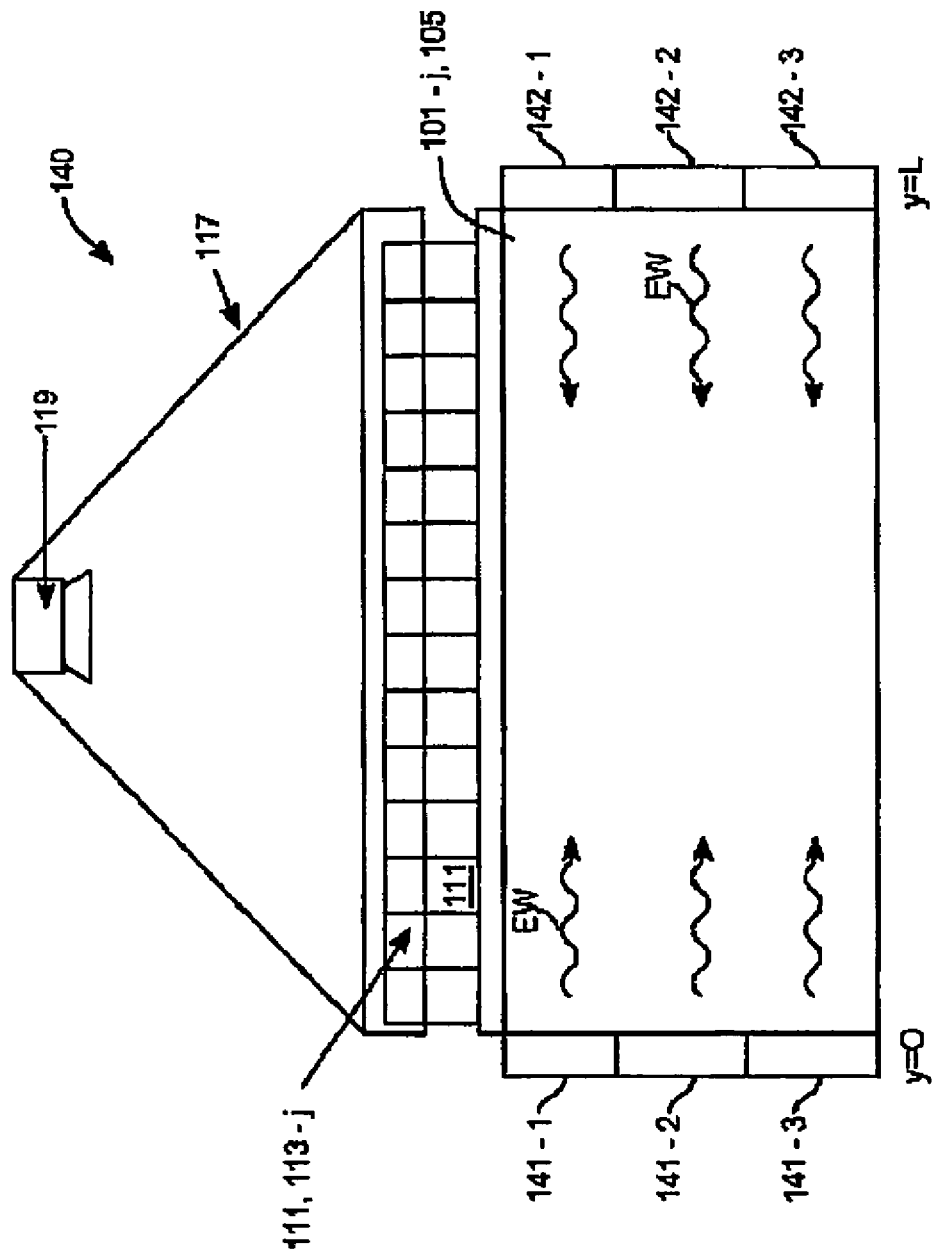

FIG. 9 schematically illustrates another system 140 for promoting approximate uniformity of acoustic cavity density within the particle removal liquid 105. In FIG. 9, a surface 101-j is again viewed on its side, a first set of transducers 141-h1 (h1=1, ..., H1:H1≧2) is located at a first end of the surfaces 101-j, and a second set of transducers 142-h2 (h2=1, ..., H2; H2≧2) is located at a second, opposed end of the surfaces 101-j. The intensity of the acoustic excitation EW produced by an individual transducer, 141-h1 or 142-h2, will monotonically decrease as the distance from that transducer increases. As a first approximation, a Beers' law for absorption is adopted, according to which the amplitude A(y) of an acoustic field produced by one of the transducers 141-h1 is approximately $$A0 \times e^{\{-\alpha y\}}$$

where $A0$ is an initial amplitude and $\alpha$ (>0) is an amplitude decay parameter that may vary with input frequency f and/or with the chemical and physical nature of the removal liquid. At any location in the removal liquid having a coordinate value y ($0 \leq y \leq L$), the sum of the contributions from the transducers 141-h1 on one side and from the transducers on the other side provides a total amplitude $$A(y) = A0 \times e^{\{-\alpha y\}} + A0 \times e^{\{-\alpha(L-y)\}} \qquad (4)$$
$$= 2 \times A0 \times e^{\{-\frac{\alpha L}{2}\}} \times \cosh\{\alpha(y-L/2)\}$$
$$\approx 2 \times A0 \times e^{\{-\alpha L/2\}} \times \left[1 - \frac{(\alpha(y-L/2))^2}{2} + O((y-L/2)^4)\right]$$

which has a minimum at y=L/2 and increases slowly with increasing coordinate values |y−L/2|. Assuming that a Beers' law absorption is approximately correct here, the maximum fractional difference of the acoustic field amplitude becomes $$\{A(y=0) - A(y=L/2)\}/A(y=L/2) = \cos h\{\alpha(L/2)\} - 1 \qquad (5)$$

The function $\cos h\{\alpha(L/2)\} - 1$ is monotonically increasing in the variable $\alpha L/2$ and has a value of 0.0984, for example, for $\alpha L/2 = 0.44$; the average acoustic cavitation density is within 10 percent of being uniform for $\alpha L/2 \leq 0.44$.

For a fixed surface length L, this difference can be made smaller by appropriate choice of the removal liquid, where a small value of the decay parameter $\alpha$ is preferred. The embodiment shown in FIG. 9 may be used for cleaning of individual surfaces or for cleaning batches of surfaces. In the embodiment shown in FIG. 9, uniformity of the amplitude of an acoustic field generated by transducers is promoted by a symmetric arrangement of transducers on each of two opposed ends of a surface or an assembly of surfaces.

Figure 10:
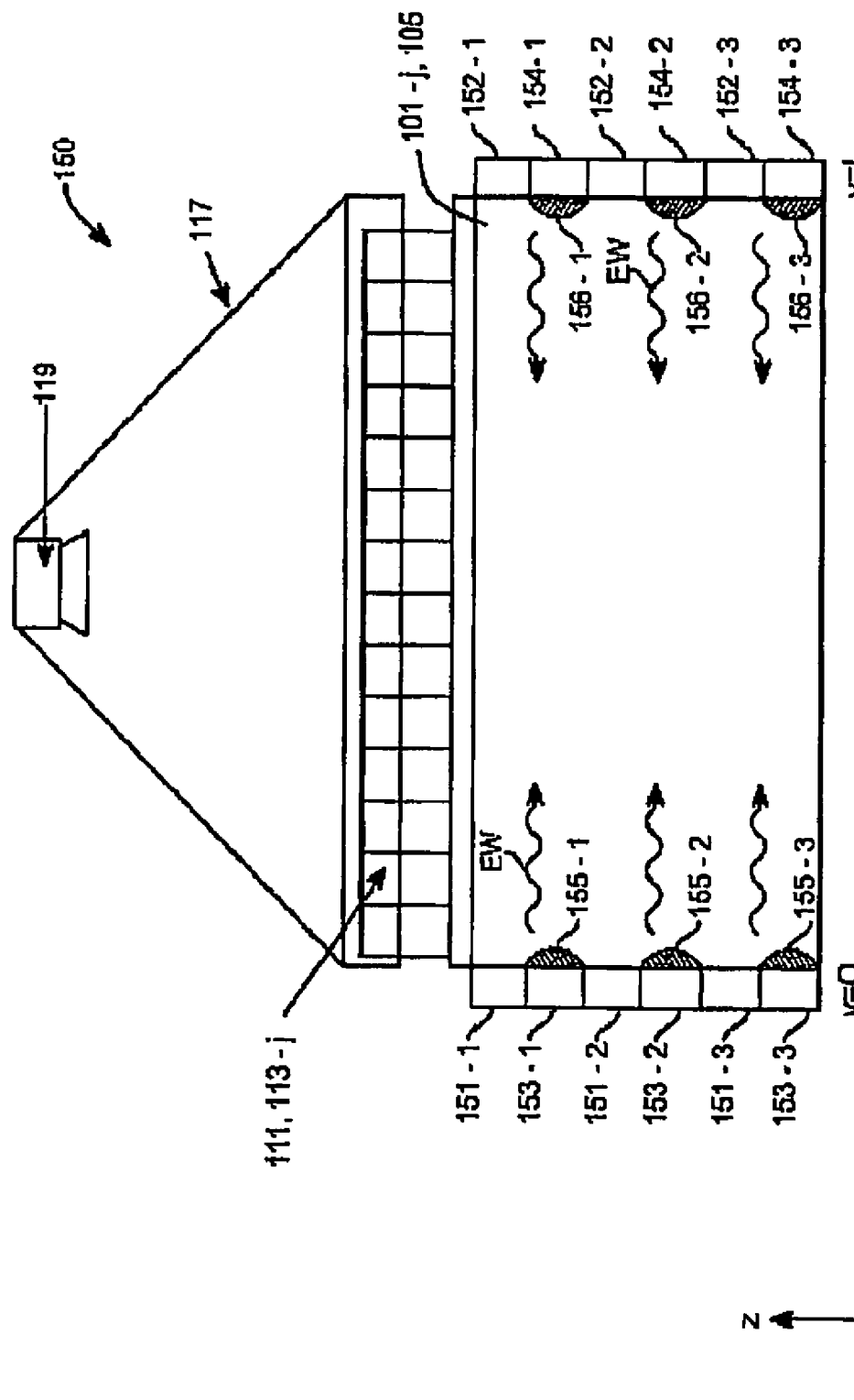

Another approach to improving the uniformity of average acoustic cavitation density is schematically illustrated in the system 150 in FIG. 10. A surface 101-j is again viewed on its side, a first set of transducers 151-h1 (h1=1, ..., H1: H1≧2) is located at a first end of the surfaces 101-j, a second set of transducers 152-h2 (h2=1, ..., H2; H2≧2) is located at a second, opposed end of the surfaces 101-j, a third set of transducers 153-h3 (h3=1, ..., H3; H3≧2), having corresponding transducer lenses 155-h3 and being located at the first end of the surfaces 101-j, and a fourth set of transducers 154-h4 (h4=1, ..., H4; H4≧2), having corresponding transducer lenses 156-h3 and being located at the second end of the surfaces 101-j, as shown.

Each transducer lens 155-h3 is "focused" at a positive distance $\Delta y = L/2$ from the first end, and each transducer 156-h4 is "focused" at a positive distance $\Delta y = L/2$ from the second end. The third set and fourth set of focused transducers, 153-h3 and 154-h4, together produce an average acoustic cavitation density that is estimated to be approximately $$B(y) \approx B0 \times e^{\{-\beta^2(y-L/2)^2\}} \qquad (6)$$

which has a maximum at y=L/2 and decreases monotonically as the difference y=y−L/2| increases. Where only the third and fourth sets of (focused) transducers, 155-h3, 154-h4, 155-h3 and 156-h4, are present, an appropriate measure of uniformity of average acoustic cavitation density is $$\{B(y=L/2) - B(y=0)\}/B(y=L/2) = 1 - e^{\{-(\beta L/2)^2\}} \qquad (7)$$

which can be compared with the measure of uniformity set forth in Eq. (5).

Figure 11:
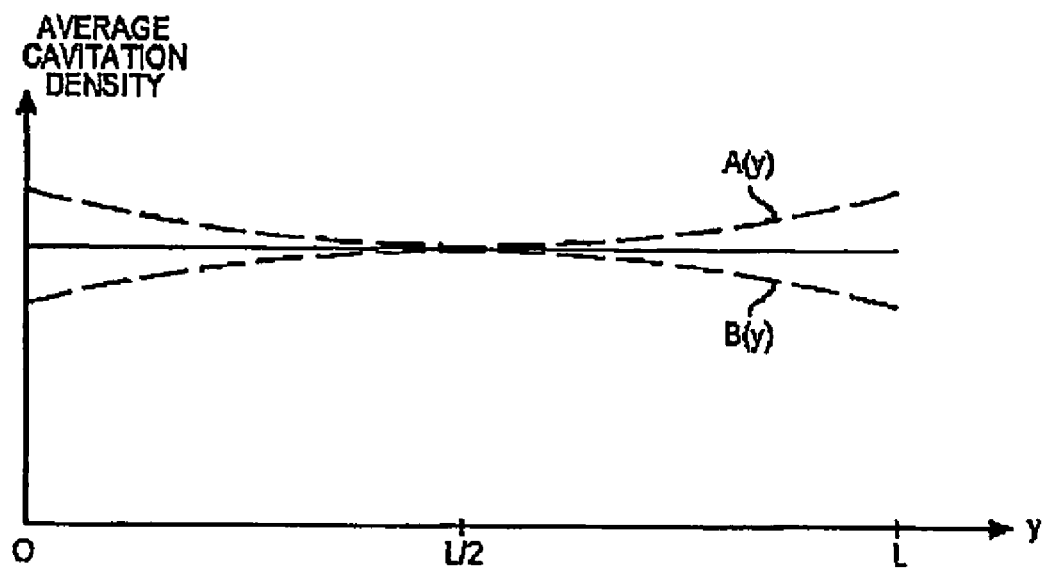
FIG. 11 graphically illustrates estimated cavitation density for two transducer configurations.

FIG. 11 graphically illustrates variation of the density estimates A(y) and B(y) with the location coordinate y. Each of A(y) and B(y) is approximately symmetric about the location value y=L/2, with A(y) being monotonically increasing and B(y) being monotonically decreasing with increasing values of |y−L/2|.

Where the first and second set of transducers and the third and fourth set of focused transducers are activated simultaneously, the resulting average acoustic cavitation density is approximately the sum $$D(y) = A(y) + B(y) \qquad (8)$$
$$= 2 \times A0 \times e^{\{-\alpha L/2\}} \times \cosh\{\alpha(y-L/2)\} + B0 \times e^{\{-\beta^2(y-L/2)^2\}}$$

Ideally, the parameters $A0$, $B0$, $\alpha$ and $\beta$ are arranged to satisfy $$0 \leq |dA/dy + dB/dy| \min\{|dA/dy|, |dB/dy|\} \qquad (9)$$

so that the average acoustic cavitation density for the combined first, second, third and fourth set of transducers is more uniform, as a function of the variable y, than either the first/second set of transducers or the third/fourth set of transducers. Over a small range of the coordinate difference $\Delta y = |y - L/2|$, including $\Delta y = 0$, the slope magnitude |dA/dy| is at least as large as the slope magnitude |dB/dy|. After rearrangement of the terms, over this range (e.g., $|\Delta y| \leq \Delta y0$) one requires that $$\frac{(A0/B0)\sinh\{\alpha\Delta y\}/\alpha\Delta y} = (A0/B0)\{1+(\alpha\Delta y)^2/6+O(\alpha\Delta y)^4\}/ \quad (10)$$

$$\alpha\Delta y \geq (\beta/\alpha)^2 e^{\{-(\beta/\alpha)^2(\alpha\Delta y)^2\}}$$

$$= (\beta/\alpha)^2\{1-(\beta/\alpha)^2(\alpha\Delta y)^2+O(\beta/\alpha)^4(\alpha\Delta y)^4\}$$

The constraint in Eq. (10) is satisfied for a modest range of the variable $\alpha\Delta y$, including $\alpha\Delta y=0$ in its interior, if the constraint $$(A0/B0) \geq (\beta/\alpha)^2 \quad (11)$$

is satisfied. More generally, the constraint in Eq. (10) is satisfied for some non-zero range of values of the variable $\alpha\Delta y$. By appropriate choice of the parameters A0, B0, $\alpha$ and $\beta$, one can ensure that the difference $$\{D(y=L/2) - D(y=0)\}/D(y=L/2) = \{A(y) + B(y) - A(L/2) - B(L/2)\}/ \quad (12)$$
$$\{A(L/2) + B(L/2)\}(0 \leq \Delta y \leq \Delta y_0)$$

satisfies Eq. (9) so that uniformity of the average acoustical cavitation of the combination is improved vis-a-vis use of the first/second sets of transducers or use of the third/fourth sets of transducers. More generally, one can combine a first group of transducers with a second group of transducers, having a monotonically increasing cavitation density and a monotonically decreasing cavitation density, respectively, about an interior location (e.g., y=L/2, the mid-point) to provide a combined group of transducers having a more uniform cavitation density. Using the transducer systems illustrated in FIGS. 9 and 10, the average acoustical cavitation density can be made approximately uniform in each of the x-, y- and z-coordinate directions. Transducer systems that produce the cavitation densities A(y) or B(y) or the combination A(y)+B(y) can be used to promote uniformity of average acoustic cavitation densities for the test liquid and/or the particle removal liquid.

Alternatively, one or more of the lensed transducers, 155-h3 and/or 154h4, can be caused to rotate so that the location of maximum intensity for that transducer within the removal liquid 105 in FIG. 10 moves in an approximately circular sector pattern in the yz-plane. This will cause the location $(x,y,z)_{max}$ of maximum intensity corresponding to the rotating transducer to vary along that circular sector where a plurality of the lensed transducers are caused to rotate in this manner.

Figure 12:
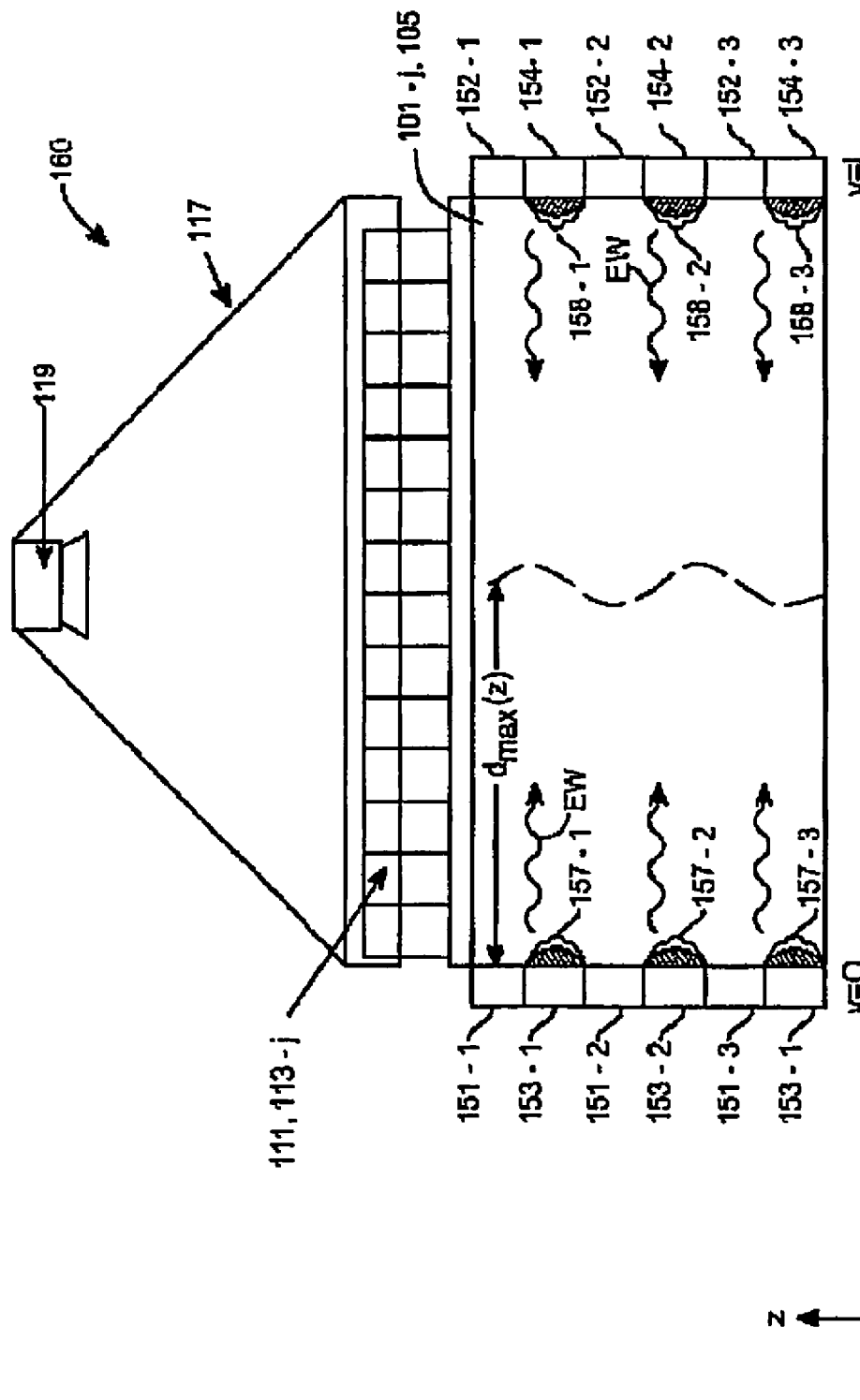
FIG. 12 schematically illustrates transducers and a plate having an array of sensors in a particle removal liquid.

Each of the lensed transducers, 155-h3 and 156-h4, in FIG. 10 can be replaced or supplemented with one or more non-planar shaped transducers 157-h5, as illustrated in FIG. 12, preferably with a concave or undulating shape factor h=h(z) that causes the transducer energy received at any location (x,y,z) in the particle removal liquid 105 to achieve a maximum value, not close to the side wall (x≈0), but at a selected positive distance x=$d_{max}(z)$, which may vary with the distance z along the side wall. For example, if the shape factor is approximately sinusoidal (e.g., h(z)≈h0−h1 sin κz), the distance $d_{max}(z)$ will also vary approximately periodically with period 2π/κ, as suggested in FIG. 13.

Figure 13:
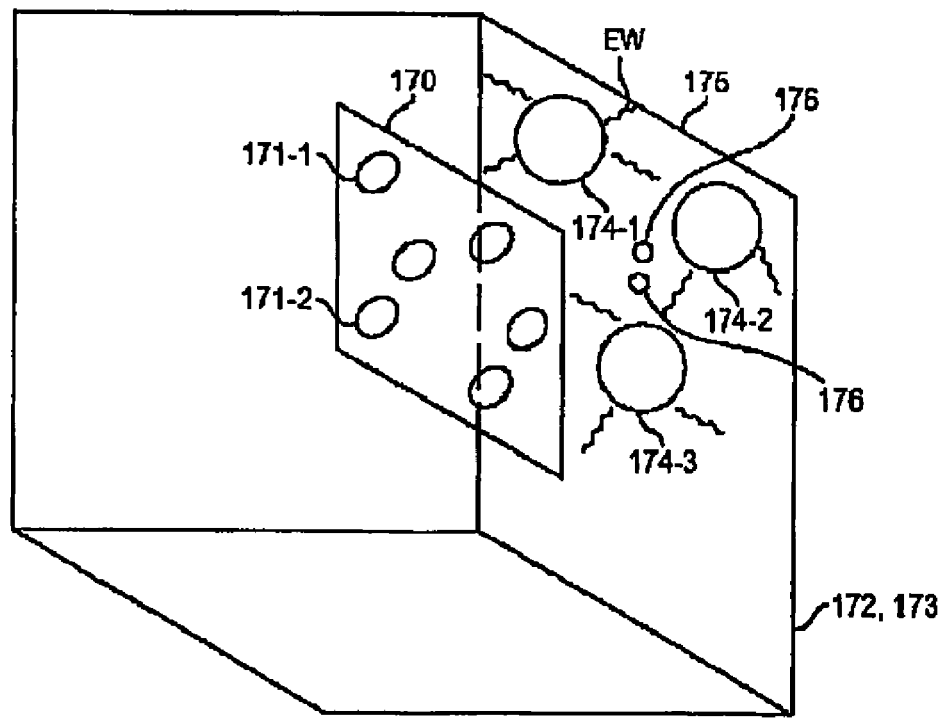

In FIG. 13, a sensor plate 170 containing an array of acoustic cavity sensors 171-j (j=1 ..., J; J≥2) is positioned in a container 172 containing particle removal liquid 173. An array of acoustic cavity transducers 174-k (k=1, ..., K; K≥2) is positioned on a wall 175 of the container 172, and a plane of the sensor plate 170 is substantially parallel to a plane of the transducer wall 175, with a selected separation distance d (≈0.5-5 cm). The transducers are, for example, shaped (non-planar) transducers. The array of transducers 174-k is activated and produces a two-dimensional spatial distribution D(x,y;t) of acoustic cavities 176 within the particle removal liquid 173 that are sensed and a time average D(x,y;avg) is formed over a time interval of selected temporal length t(avg), such as 0.5-15 sec. A reference or ideal distribution of cavities for an ideal distribution of cavities D(x,y;ref) is provided, and a selected non-negative combination C{D(x,y;avg),D(x,y;ref)} is formed and compared with a threshold value $C_{thr}$ for a selected sequence $\{(x_i,y_i)\}$ i of I locations (I≥2) on or adjacent to the array of transducers 174-k. The combination C is preferably homogeneous of degree β in the sense that $$C\{\alpha D(x,y;avg), \alpha D(x,y;ref)\} = |\alpha|^\beta CD(x,y;avg), \quad (13)$$
$$D(x,y;avg; \text{ideal})$$

where $\alpha$ is an arbitrary real number and $\beta$ is a fixed real number (including 0) that is characteristic of the combination C. Ideally, the combination C is 0 when the measured distribution is the same as the reference distribution, and, optionally, $$C\{D(x,y;\text{test}), D(x,y;\text{test})\}=0 \quad (14)$$

for any (arbitrary) test distribution of cavities D(x,y;test).

If, for example, the combination C is a difference, the threshold requirement is stated as $$C\{D(x,y;avg), D(x,y,ref)\} = \quad (15)$$
$$\left\{\sum_{i=1}^{I} w_i |D(x_i, y_i; avg) - D(x_i, y_i, ref)|^\mu\right\}^{1/\mu} \leq C_{thr}$$

where $\{w_i\}_i$ is a selected set of non-negative weighting coefficients (with sum=1), $\mu$ is a selected non-zero constant (positive or negative) and $C_{thr}$ is a suitable small fraction of a spatial average <D(x,y;avg.ref)> over all pairs (x,y). By choosing $w_i$=1/I for all i and $\mu$=1, one requires that the sum of the differences be no greater than $C_{thr}$. If the combination C is a ratio, a threshold requirement is $$C\{D(x,y;avg), D(x,y,ref)\} = \quad (16)$$
$$\left\{\sum_{i=1}^{I} w_i |D(x_i, y_i; avg)/D(x_i, y_i, ref) - 1|^\mu\right\}^{1/\mu} \leq C'_{thr}$$

where $C'_{thr}$ is a suitable small fraction, such as 0.1. Another suitable combination C and associated threshold requirement is $$C\{D(x,y;avg), D(x,y,ref)\} = \quad (17)$$
$$\left\{\sum_{i=1}^{I} w_i |D(x_i, y_i; avg)/D(x_i, y_i, ref)|^\mu\right\}^{1/\mu} \geq C_{thr}$$

where $C''_{thr}$ is a suitable fraction, such as 0.9. More generally, the combination C can be defined as $$C\{D(x, y; avg), D(x, y, ref)\} = \sum_{i=1}^{I} w_i F\{D(x_i, y_i; avg)/D(x_i, y_i, ref)\} \quad (18)$$

where F(r) is a monotonically increasing function, or a monotonically decreasing function, of the variable r, with a corresponding threshold condition ($C \leq C_{thr}$ or $C \geq C_{thr}$).

If the value of the combination C satisfies the associated threshold test, the transducer array is accepted; otherwise, the performance of the transducer array is determined to be non-acceptable. This approach provides a virtual wafer, the plate 170, for monitoring the acoustic cavity distribution produced by a transducer array.

Transducer action that is initially required to establish an acoustic cavitation field may differ from transducer action required (or sufficient) to maintain the field. Where the initial and maintenance transducer action are different, one or more transducer parameters (e.g., activation energy and/or transducer frequency) is changed after the field is initially established. For example, the transducer activation energy may need to be reduced after the field is established, as suggested by some experimental results reported by FERRELL, G., et al. "A novel cavitation probe design and some preliminary measurements of its application to megasonic cleaning. J. Acoust. Soc. Am. 2002, vol. 112, p. 1196-1202. As illustrated graphically in FIG. 14, (cavitation brightness versus time for transducer power levels of 50, 100, 200, 300, 400 and 500 Watts), imposition of too much cavitation may interfere with propagation of the acoustic field. This interference may increase non-uniformity of the cavitation density, an undesirable effect, or cause damage of the object surface, by distortion of initially parallel lines in an object surface.

A first alternative approach involves initial addition of an inert fluid, such as Ne or Ar, to the initial test fluid or particle removal fluid, to encourage initial formation of acoustical cavities; after which the inert fluid is withdrawn or the inert fluid concentration is changed in a timed manner, for example, by bleeding off liquid that contains the inert fluid. Timed variation of one or more transducer parameters, as the acoustical cavitation field is initially established and subsequently maintained, promotes approximately uniform cavitation density in a fourth dimension, time.

In a second alternative approach, application of the cavitation energy may be given a "soft start," in which the transducer power is ramped up slowly rather than substantially instantaneously, in order to suppress appearance of a sharp maximum in photons observed (as in FIG. 14) and to suppress this interference.

In a third alternative approach, the transducer power is ramped up slowly and, after cavitation energy is approaching an asymptote, the inert fluid from the first approach is introduced into the test fluid or particle removal fluid.

In a fourth alternative approach, intended to avoid damage to the object surface, transducer power is ramped up to a desired final value, without presence of the object to be cleaned; the object(s) is then immersed in the test liquid or particle removal liquid; and the process continues as discussed in the preceding.

When a wafer is subjected to liquid cavitation from acoustic waves, the wafer should not be tightly attached to the wafer holder. Tight attachment of the wafer to the wafer holder allows or encourages development of an equivalent of Newton's rings, with permanent locations of peaks and valleys, on a wafer surface, arising in part from "illumination" of the partly constrained wafer surface by acoustic waves, analogous to mechanical excitation of a partly constrained membrane. Where a wafer is very loosely held in a wafer holder so that no point on the wafer surface is a permanent node that is fixed in location, the acoustic waves will provide random patterns that vary from one time to another so that, on average, no region of the wafer surface is subjected to substantially more, or substantially less, acoustic cavitation effects than is any other region on the wafer surface. Development of the equivalent Newton's rings with more or less fixed locations on a wafer surface will produce undesirable and substantial differences in time-averaged cavitation density effects on different regions of the wafer surface.

In a first approach to remove or suppress the effects of presence of equivalent Newtons rings with fixed locations, a wafer held in a wafer holder may be allowed to move laterally in a range of 0.1-5 times the wafer thickness (or greater) in order to approximate a completely free wafer and to avoid appearance of equivalent Newtons rings with fixed locations.

Figure 16:
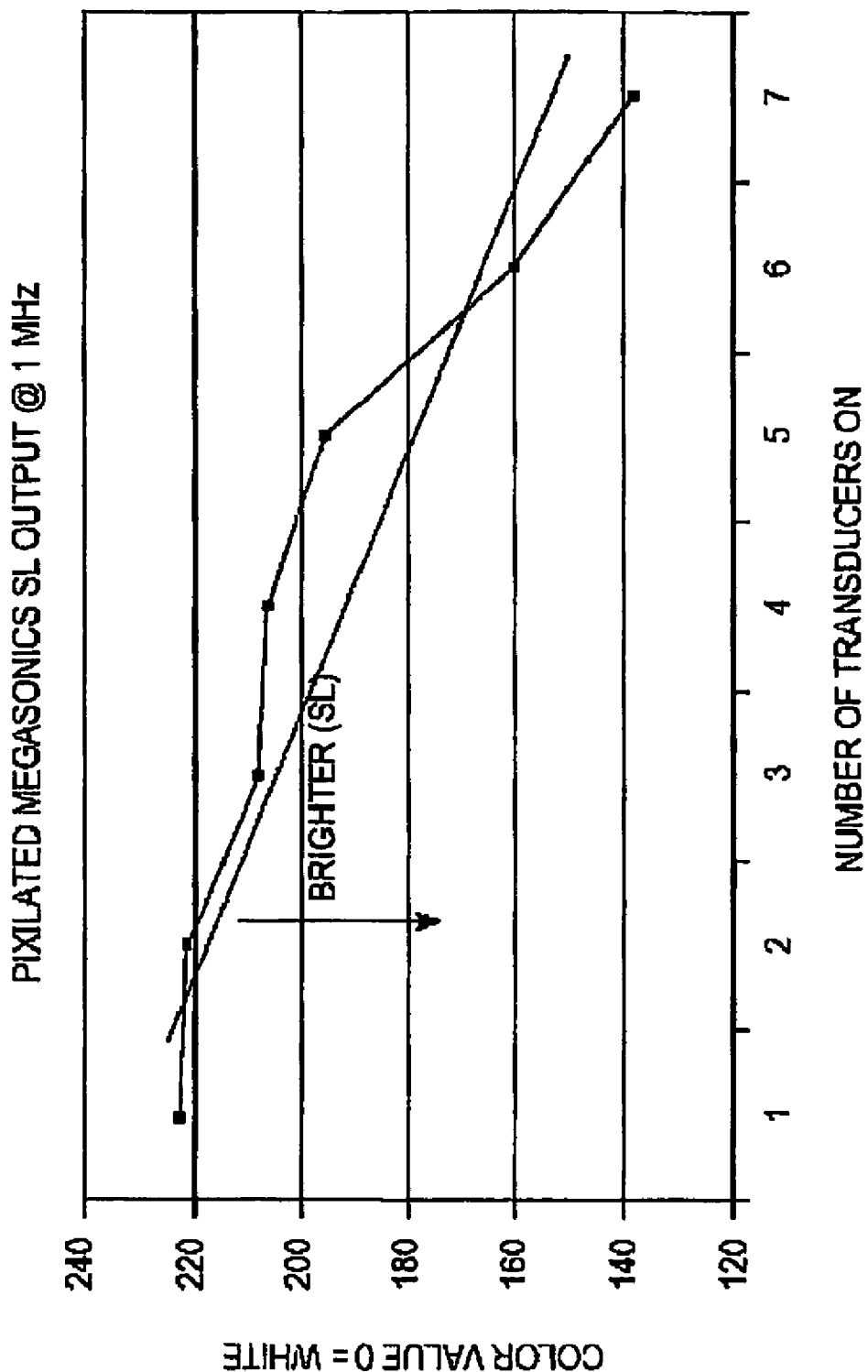
FIG. 16 graphically illustrates increase in cavitation brightness with increase in the number of active adjacent transducers.

In a second approach to remove or suppress the effects of presence of equivalent Newtons rings with fixed locations a vector normal to a plane Tr defining the wafer surface is dithered in time by an angle $\Delta\phi$ in a range 0.2°-10° (preferably no more than about 2°) to approximate a completely free wafer. In FIG. 16, a wafer 237 is attached to a wafer chuck 239 and/or to a shaft 241 and the shaft angle $\Delta\phi$ is dithered, using a random or pseudo-random angle orientation pattern for the shaft. The shaft 241 is rotatable and ditherable within the chuck mounting 243. The wafer chuck has electronic feedback to allow for position control in a rotational axis. The pivot mechanism 227 has electronic feedback to allow for position control in an angular axis. The pivot mechanism 227 causes shaft 241 to pivot at a pivot point 245. The wafer and chuck may be immersed in a particle removal liquid contained in, for example, a tray (not shown).

As the number of activated acoustic cavitation transducers increases, the cleaning liquid in which the transducers are located becomes "brighter" in the sense that an average color value associated with the acoustic wave field increases monotonically from a "dark" color value (with no transducer activated) toward higher color values that correspond to progressively brighter acoustic cavitation wave fields. This increase in color value is nearly, but not strictly, linear, as illustrated graphically in FIG. 16, which indicates variation in color value with an increase in number of adjacent activated transducers within a test liquid or cleaning liquid at an output frequency of 1 MHz and input power to each transducer corresponding to about 4 Volts.

In one embodiment of the invention, light (photon counts) are produced by an acoustic cavitation wave field where u=3, 5, 7 and 9 adjacent transducers are activated in a cleaning liquid (here, DI water). A first region, adjacent to location of the activated transducers, is relatively brighter than a second, relatively dark region. The numerical area of the first region and its associated brightness increase faster than linearly with the number u of activated transducers (roughly as the square of the number u). This is surprising and indicates presence of one or more synergistic effects associated with the number u of adjacent activated transducers. If each of the activated transducers was substantially isolated from each of the other activated transducers, the numerical area of the first region would likely increase linearly with u, and the associated brightness would likely be approximately constant with increasing u.

This monotonic increase in brightness, with increase in number u of adjacent activated transducers, expressed as $$\phi = f(u), \quad (19)$$

can be combined with an estimate, $$X = g(\beta), \quad (20)$$

of the cleaning capability of the acoustic cavitation field corresponding to the brightness $\phi$. This combination will provide an estimate of the number u of adjacent activated transducers needed to provide a given cleaning power X (e.g., average number of particles removed from a surface per unit surface area and per unit time), by inverting the expression $$X = g\{f(u)\} \quad (21)$$

to obtain u as a function of X. The $\phi$ versus u relationship in Eq. (19) can be obtained by observation. The X versus $\phi$ relationship in Eq. (20) will need to be experimentally determined for each particle removal liquid, each transducer power level, each type of particle to be removed, and each object surface (e.g., a wafer surface) of interest. Where only a short time interval (e.g., 15 sec) can be devoted to particle removal on a given surface, the number u of adjacent activated transducers will need to be increased relative to the number used for a longer exposure time (e.g., 60 sec).

Cavitation density for a nine-transducer array is compared at different voltages. Where the applied voltage is varied from 3.4 to 4.7 Volts for each transducer, a more uniform density results as compared to where the applied voltage for each transducer is uniformly 5 Volts. The presence of several 'hot spots' and "cold spots" are seen where the voltage is uniformly 5 Volts thus the cavitation density may produce (i) damage to the object surface and/or (ii) unacceptable variations in the particles remaining on the object surface.

Appearance of observable acoustic cavitation is a threshold event, depending upon the presence of several variables, not all of which have yet been identified. Variables that are known to affect the presence or absence of observable acoustic cavitation include: number of active and adjacent transducers; electrical power applied to each active transducer; transducer frequency(ies) applied; presence (or absence) and concentration of a fluid that helps promote cavitation; surface tension of the particle removal or test liquid; and temperature of the particle removal or test liquid. Use of a non-optimum value for one of these variables can be compensated for by use of a more optimum value of one or more of the other variables.

The embodiments illustrated herein are suitable for single wafer processing or batch processing of wafers (especially those illustrated in FIGS. 8-10 and 12-15). By smoothly varying the acoustic cavitation density with location on a wafer surface, this density can be adjusted to compensate for the effects of linear velocity V of different small regions of the wafer surface, where V varies (approximately linearly) with radial distance r from the axis of wafer rotation.

The invention claimed is:

1. A method for removal of one of more particles on a surface, the method comprising:
   providing an assembly of two or more activatable transducers, with each transducer being capable of generating at least one cavity in a selected particle removal liquid, where the generated cavity subsequently collapses and provides a mechanism for removal of at least one particle on a surface suspended in the particle removal liquid;
   electrically connecting said transducer assembly to a servo control unit;
   immersing the transducer assembly in a selected test liquid;
   activating at least one transducer of said transducer assembly;
   measuring cavity density produced by the at least one transducer;
   determining whether to adjust at least one parameter of the at least one transducer;
   using said servo control unit to adjust the at least one parameter if adjustment occurs;
   removing the transducer assembly from the test liquid, disconnecting the transducer assembly from the servo control unit, and immersing the transducer assembly in the particle removal liquid after the servo control unit is disconnected; and
   activating the at least one transducer in the particle removal liquid, and allowing at least one cavity produced by at least one of the transducers to collapse and to thereby remove at least one particle on a surface immersed in the particle removal liquid.

2. The method of claim 1, further comprising selecting said particle removal liquid and said test liquid to be substantially the same liquid.

3. The method of claim 1, further comprising selecting said particle removal liquid from the group of liquids consisting of $H_2O$, $NH_3$, $H_2O_2$, $H_2SO_4$ and $O_3$ dissolved in DI water.

4. The method of claim 1, further comprising selecting said test liquid from the group of liquids consisting of DI water and DI water plus an inert fluid drawn from Ne, Ar, Kr and Xe.

5. The method of claim 1, further comprising causing each of the at least one transducers to emit a selected output frequency in said particle removal liquid, where each selected frequency is in a range 100-3000 KHz.

6. The method of claim 1, further comprising:
   suspending at least a second surface in said particle removal liquid, when said at least one transducer is activated; and
   allowing at least one additional cavity produced by said at least one transducer to collapse and to thereby remove at least one particle on the second surface immersed in said particle removal liquid.

7. A method for removal of one or more particles on a surface, the method comprising:
   providing an assembly of two or more activatable transducers, with each transducer being capable of generating at least one cavity in a selected particle removal liquid, where the generated cavity subsequently collapses and provides a mechanism for removal of at least one particle on a surface suspended in the particle removal liquid;
   electrically connecting said transducer assembly to a servo control unit;
   immersing the transducer assembly in a selected test liquid;
   activating a first transducer in the assembly to produce at least one cavity in the test liquid, estimating a first representative cavitation density $\rho_{cav}(1)$ produced by the first transducer and computing a first difference, $|\rho_{cav}(1) - \rho_{cav}(\text{ref})|$, where $\rho_{cav}(\text{ref})$ is a selected reference cavitation density,
   when the magnitude of the first difference is greater than a selected difference threshold $\Delta\rho_{thr}$, adjusting at least one parameter on the first transducer with the servo control unit so that at least one of the following conditions is satisfied: (i) the magnitude of the first difference is reduced to no greater than the difference threshold and (ii) the magnitude of the first difference is minimized;

activating a second transducer in the assembly to produce at least one cavity in the test liquid, estimating a second representative cavitation density $\rho_{cav}(2)$ produced by the second transducer, and computing a second difference, $|\rho_{cav}(2)-\rho_{cav}(ref)|$;

when the magnitude of the second difference is greater than $\Delta\rho_{thr}$, adjusting at least one parameter on the second transducer with the servo control unit so that at least one of the following conditions is satisfied: (i) the magnitude of the second difference is reduced to no greater than the difference threshold and (ii) the magnitude of the second difference is minimized;

removing the transducer assembly from the test liquid, disconnecting the transducer assembly from the servo control unit, and immersing the transducer assembly in the particle removal liquid after the servo control unit is disconnected; and activating at least the first and second transducers in the particle removal liquid, and allowing at least one cavity produced by at least one of the first and second transducers to collapse and to thereby remove at least one particle on the surface immersed in the particle removal liquid.

8. A method for removal of one or more particles on a surface, the method comprising:

providing an assembly of N activatable transducers, with N>2, with each transducer being capable of generating at least one cavity in a selected particle removal liquid, where the generated cavity subsequently collapses and provides a mechanism for removal of at least one particle on a surface suspended in the particle removal liquid;

electrically connecting said transducer assembly to a servo control unit;

immersing the transducer assembly in a selected test liquid;

activating each of a subset if N' transducers in the assembly, numbered n'=1, . . . , n', with 1<n'≦N to produce at least one cavity in the test liquid for each activated transducer in the subset, estimating a representative cavitation density $\rho_{cav}$,n') produced by transducer number n', and computing a density difference, $\Delta\rho=|\rho_{cav}-\rho_{cav}(ref)|$, for each of n'=1, . . . , N', where $\rho_{cav}(ref)$ is a selected reference cavitation density, forming a statistical average $D\{\Delta\rho(n1), \ldots, \Delta\rho(N')\}$ of the N' density differences;

when the statistical average $D\{\Delta\rho(n1), \ldots, \Delta\rho(N')\}$ is greater than a selected difference threshold $\Delta\rho_{thr}$, adjusting at least one parameter for at least one of the N' transducers with the servo control unit so that at least one of the following conditions is satisfied: (i) the statistical average $D\{\Delta\rho(n1), \ldots, \Delta\rho N')\}$ after the adjustment is reduced to a value no greater than the difference threshold and (ii) the magnitude of the statistical average $D\{\Delta\rho(n1), \ldots, \Delta\rho(N')\}$ is minimized;

removing the transducer assembly from the test liquid, disconnecting the transducer assembly from the servo control unit, and immersing the transducer assembly in the particle removal liquid after the servo control unit is disconnected; and activating at least the N' transducers in the particle removal liquid, and allowing at least one cavity produced by at least one of the N' transducers to collapse and to thereby remove at least one particle on the surface immersed in the particle removal liquid.

9. The method of claim 8, further comprising choosing said statistical average to be given approximately by $$D(\Delta\rho(1), \ldots, \Delta\rho(I)) = \left\{\sum_{i=1}^{I} w(i) \times \{\Delta\rho(i)\}^p\right\}^{1/p}$$

where p is a selected positive number and w(i') is a non-negative weight coefficient satisfying a constraint $$\sum_{i=1}^{I} w(i) = 1$$

* * * * *

UNITED STATES PATENT AND TRADEMARK OFFICE
CERTIFICATE OF CORRECTION

PATENT NO. : 7,645,343 B2
APPLICATION NO. : 10/559894
DATED : January 12, 2010
INVENTOR(S) : Gary W. Ferrell et al.

It is certified that error appears in the above-identified patent and that said Letters Patent is hereby corrected as shown below:

Column 15, Claim 8, the equation should read:

$$\Delta\rho(n') = |\rho_{cav}(n') - \rho_{cav}(ref)|$$

Column 15, Claim 8, cavitation density should read:

$$\rho_{cav}(n')$$

Column 16, Claim 8, equation for the statistical average should read:

$$D\{\Delta\rho(n1), \ldots. \Delta\rho(N')\}$$

Signed and Sealed this
First Day of November, 2011

David J. Kappos
*Director of the United States Patent and Trademark Office*